(12) United States Patent
Enright et al.

(10) Patent No.: US 11,064,634 B1
(45) Date of Patent: Jul. 13, 2021

(54) TESTING METHODS AND APPARATUSES USING SIMULATED SERVERS

(71) Applicant: TMGCORE, LLC, Plano, TX (US)

(72) Inventors: John David Enright, Plano, TX (US); Jacob Mertel, Plano, TX (US); Taylor Monnig, Plano, TX (US); William Hadala, Plano, TX (US)

(73) Assignee: TMGCore, LLC, Plano, TX (US)

( * ) Notice: Subject to any disclaimer, the term of this patent is extended or adjusted under 35 U.S.C. 154(b) by 0 days.

(21) Appl. No.: 17/136,113

(22) Filed: Dec. 29, 2020

Related U.S. Application Data

(60) Provisional application No. 62/981,098, filed on Feb. 25, 2020.

(51) Int. Cl.
*H05K 7/20* (2006.01)
*G06F 1/20* (2006.01)

(52) U.S. Cl.
CPC ........... *H05K 7/20809* (2013.01); *G06F 1/20* (2013.01); *G06F 2200/201* (2013.01)

(58) Field of Classification Search
CPC .. H05K 7/203; H05K 7/20818; H05K 7/2089; H05K 7/20809; H05K 7/1427; H05K 7/20836; H05K 7/1487; H05K 7/1489; H02H 3/087; G06F 2200/201; G06F 1/20; G06F 1/206; H02J 7/045

USPC ........................................................ 361/699
See application file for complete search history.

(56) References Cited

U.S. PATENT DOCUMENTS

2012/0320527 A1* 12/2012 Nishiura ............ G01R 31/2863
361/699

OTHER PUBLICATIONS

GESS, "Experimental Investigation f a Liquid Immersion Cooled Electronics Module using Two-Phase Heat Transfer for Thermal Management", Dec. 12, 2015, Auburn University, PhD Dissertation.

* cited by examiner

*Primary Examiner* — Mandeep S Buttar
(74) *Attorney, Agent, or Firm* — Gregory L. Porter; Hunton Andrews Kurth LLP

(57) ABSTRACT

The present application pertains to testing methods and apparatus useful in two-phase liquid immersion cooling systems. Such systems cool heat generating computer components which cause a dielectric fluid in its liquid phase to vaporize. The dielectric vapor is then condensed back into a liquid phase and used to cool the computer components. Using the testing methods and apparatuses herein one may design and test more efficient components and systems. More specifically, the one or more heating elements are both passive and intelligent. They may be used to mimic the power load of a server which is used in the load testing of two phase liquid immersion cooling so actual servers are not required to test various aspects of the two phase liquid immersion cooling units.

15 Claims, 6 Drawing Sheets

FIGURE 2    101

TESTING METHODS AND APPARATUSES USING SIMULATED SERVERS

CROSS-REFERENCE TO RELATED APPLICATIONS

This application claims priority to U.S. provisional application No. 62/981,098 filed Feb. 25, 2020 which application is incorporated herein by reference. This application is also related to PCT application published as WO2020/102090 filed Nov. 11, 2019 which application is incorporated herein by reference.

FIELD

This application relates to the application of testing methods and apparatuses for two phase liquid immersion cooling and more particularly to testing and apparatuses for testing vapor management systems useful for two phase liquid immersion cooling using simulated servers.

BACKGROUND AND SUMMARY

Two-phase liquid immersion cooling systems and processes are described in, for example, U.S. Pat. No. 10,477,726 which is incorporated herein by reference. In such systems and processes heat generating computer components cause a dielectric fluid in its liquid phase to vaporize. The dielectric vapor is then condensed back into a liquid phase and used to cool the computer components. Such systems are complex and must be designed to be both efficient and effective to adequately protect the expensive computing components from damage due to, for example, excess heat and/or impurities in the system. Accordingly, what is needed are testing methodologies and testing apparatuses so one may optimize designs and/or ensure that a particular design will perform as needed to protect the computing components.

Advantageously, the present application meets the aforementioned needs and more. In one embodiment, the present application pertains to a heat blade assembly for testing two phase liquid immersion cooling components. The assembly comprises a chassis; a heat carrying material operably connected to the chassis; one or more wiring termination blocks configured to distribute electrical current through a circuit to the heat carrying material; one or more fuses between the wire termination blocks and heat carrying material; a current transducer configured to acquire data relating to operating current; and a solid state relay configured to allow control of the assembly by a multi-unit testing management system.

In other embodiments, the present application pertains to various testing methods employing the heat blade assembly.

DETAILED DESCRIPTION

Testing Apparatuses Properties and Capabilities

Figure 1:
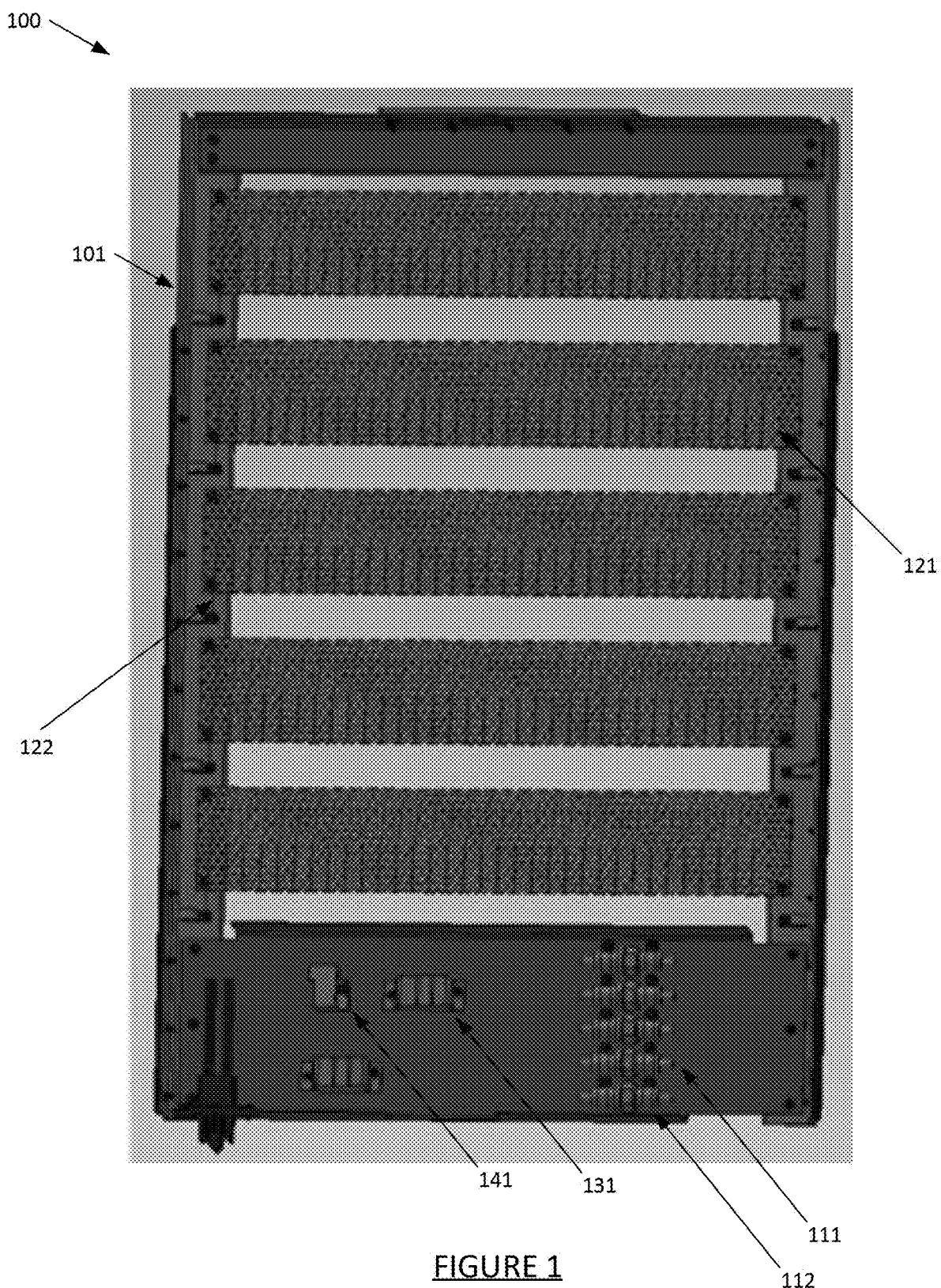
FIG. 1 shows an exemplary heat blade.

The testing of a two phase liquid immersion cooling platform may employ or require apparatuses with varying degrees of sophistication and capabilities. Depending on the testing objectives, the apparatus may employ require one or more of the following properties or capabilities described herein.

Generating a Predictable Amount of Heat

In order to effectively test the various vapor management systems within the two phase liquid immersion platform, the use of a testing apparatuses which is capable of producing an adequate quantity of heat may be required. Typically, such apparatuses would be capable of generating a quantity of heat approximately equal to the amount of heat a comparably sized production component would consume.

Dissipating the Heat Throughout the Apparatus in a Fashion Conducive with the Fluid(s) in which the Apparatus Will be Tested The immersion fluid(s) used within the two phase liquid immersion cooling platform may have varying properties with respect to their heat transfer capabilities. To that end, the testing apparatuses must be designed to generate heat throughout their heat generating surfaces in a fashion consistent with those heat transfer capabilities. Care must be taken to ensure that the heat generated by the apparatuses does not exceed the capabilities of the fluid(s).

Consuming an Appropriate Amount of Power Based on the Capabilities of the System and Associated Hardware In addition to the heat transfer capabilities of the fluid(s) being employed by the two phase liquid immersion cooling platform, the design of the testing apparatus must also consider the current carrying capacities and general power limits of the other components involved in delivering power to the testing apparatus and rejecting the heat generated therefrom. Care must be taken to ensure that the power consumption of the testing apparatus does not exceed the power delivery limits and the heat generated does not exceed the heat rejection capabilities of the two phase liquid immersion cooling platform.

Providing the Ability to be Controlled and Operated as Part of a Multi Unit Testing Management System to Generate Varying Degrees of Heat Each of the testing apparatuses used within the two phase liquid immersion cooling system must include the capability to be controlled via a centralized multi unit testing management system. This system will have the capability to activate and deactivate each of the individual testing apparatuses being used within the testing process.

Providing the Capability for the Operating Conditions of the Apparatus, Including its Current Operating Power Load, to the Testing Management System Each of the testing apparatuses used within the two phase liquid immersion cooling system must include the capability to provide data relating to its current power consumption to the multi unit testing management system. This data is of critical importance in both verifying the proper operation of the testing apparatus and verifying that a sufficient quantity of power is being consumed, and heat being generated, to achieve the testing objectives.

Being Designed in a Form Factor and with Appropriate Power, Robotic and Mechanical Interfaces Compatible with the Platforms Existing Racking and Component Management Subsystems The testing apparatuses used within the two phased liquid immersion cooling system must be designed in a fashion sufficient for interfacing with the power, robotic, and mechanical interfaces within the system. This includes being designed of a size similar or identical to the other components which will be used within the system, have the same robotic interface mechanisms, use the same guide rails, and have the same power and grounding interfaces as used by other system components.

Providing Sufficient Equipment and Life Safety Mechanisms to Ensure Safe Operation Each testing apparatus must be designed in a fashion sufficient to ensure operator safety and equipment safety. These mechanisms include ensuring that all apparatuses are assembled in a workman like manner, employ proper termination and connection fittings, demonstrate evidence of proper quality inspection and evaluation, have adequate grounding interfaces, and include appropriately sized and specified fusing or breakering mechanisms.

Heat Blade Assembly and Components

Figure 2:
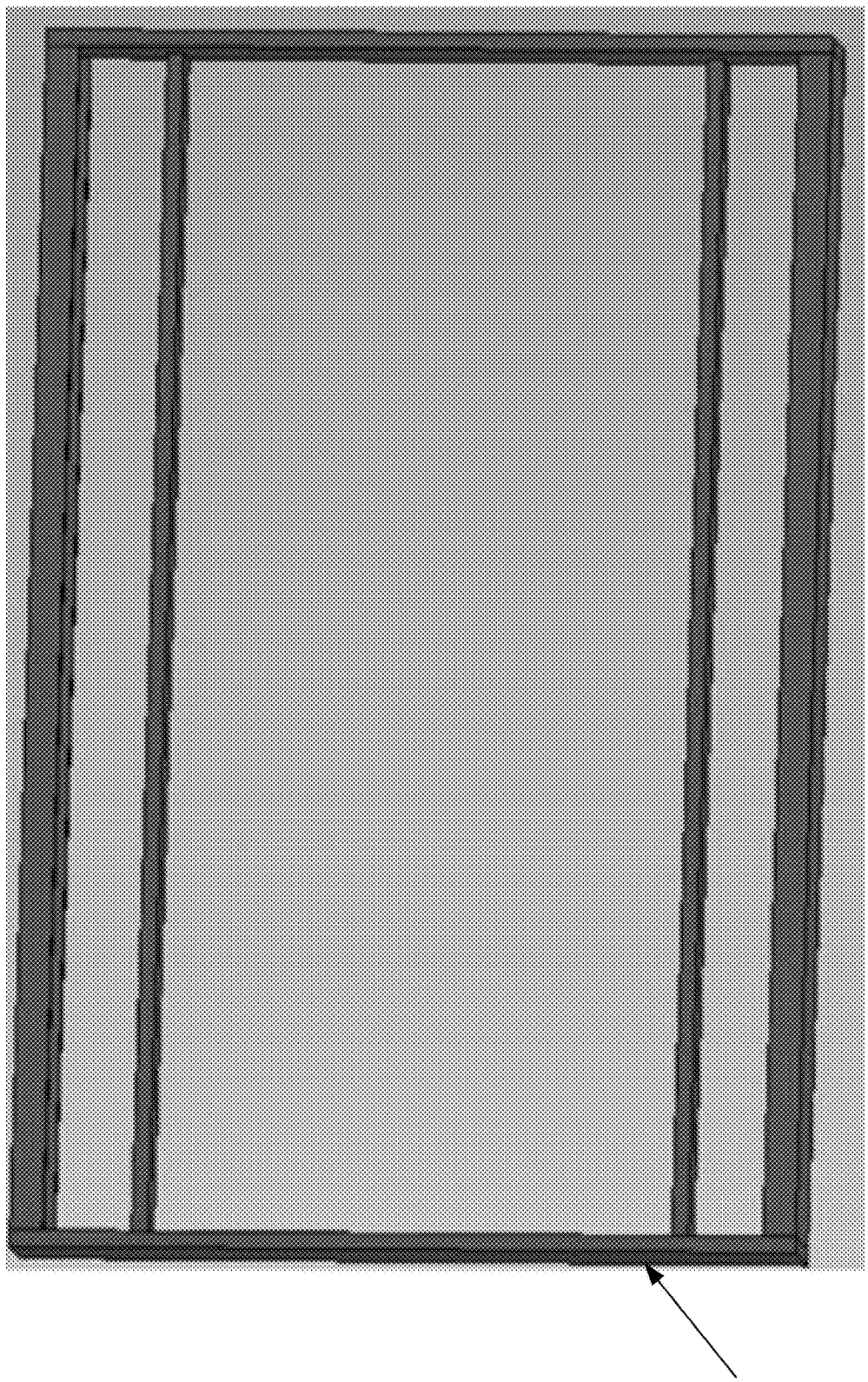
FIG. 2 shows an exemplary chassis.

FIG. 1 shows a representative complete assembly which may be referred to as a heat blade. The heat blade of shown in Figure is comprised of a number of components. First, it has an appropriate case or chassis, designed with adequate mechanical and electrical interfaces to allow for the apparatuses use within the two phase liquid immersion cooling system with which it will be used. An exemplary chassis is shown in FIG. 2.

The heat blade also comprises a number of coil winding substrates which contain sufficient mechanical interfaces to allow for attachment to the case or chassis and to support a heat carrying material. The heat carrying material may be any material that will conduct sufficient heat for testing. Generally, any wire or other material which has sufficient resistance in an appropriate electronic circuit that generates a sufficient degree of heat may be employed. In some embodiments it may be advantageous if the heat carrying material has a sufficient ratio of surface area relative to the quantity of heat being generated. In this manner the generated heat can be effectively dissipated within the immersion cooling fluid without unduly drying out too much (or any) of the surface of the heat carrying material. An exemplary heat carrying material is, for example, nickel chromium wire.

Figure 3:
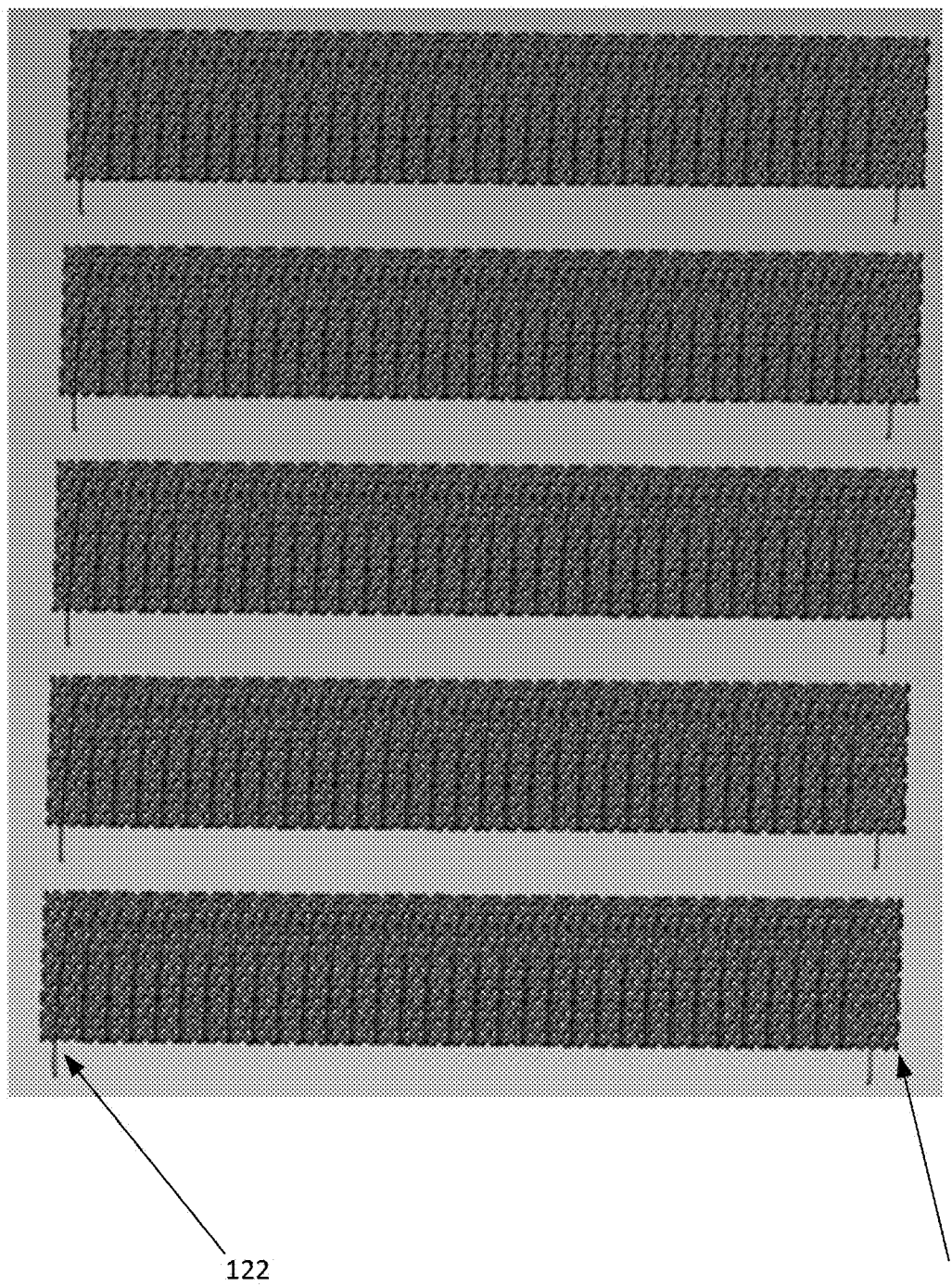
FIG. 3 shows a heat carrying material wrapped around or otherwise attached to coil winding substrates.

Nickel chromium wire and/or other appropriate heat carrying material may be provided in any suitable configuration to generate heat and conduct testing. An exemplary configuration may be one in which an appropriate heat carrying material is wrapped around or otherwise attached to coil winding substrates as shown in FIG. 3. Other suitable configurations may include those which provide an effective distribution of heat while preventing shorts or arcing that interfere with testing or unduly damage the equipment. In one embodiment horizontal bars running in the same direction as the coil winding substrates shown in FIG. 3 and comprised of a metal or other substance of sufficient heat generation capability may be a suitable alternative. In such a case the horizontal bars that are in addition or in place of FIG. 3's coil winding substrates could be attached to the heater blade using an appropriate attachment such as non-conductive standoffs.

Figure 4:
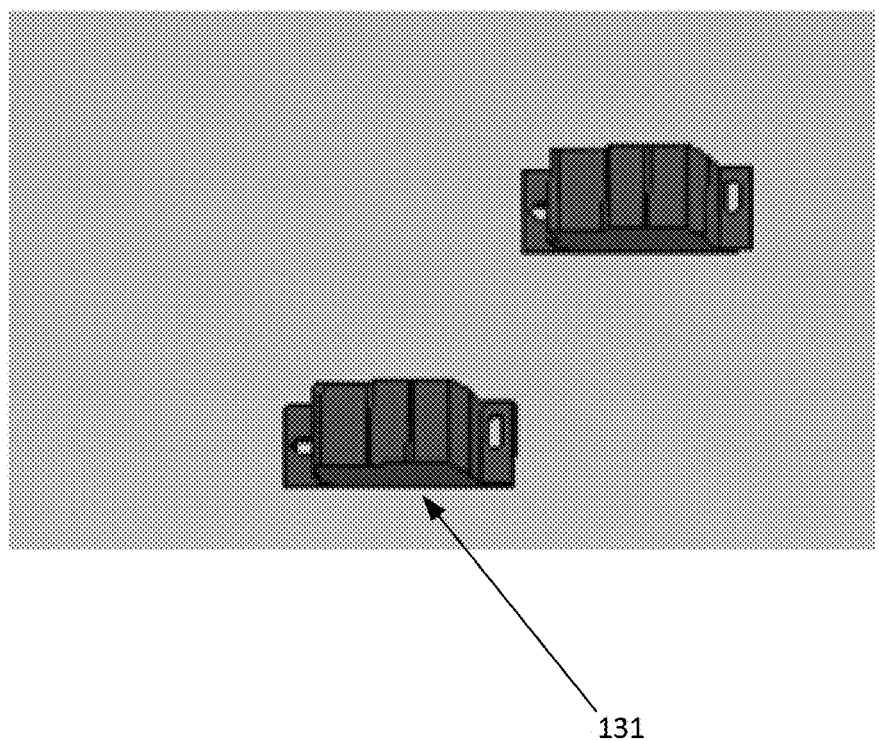
FIG. 4 shows exemplary wiring termination blocks.

The heat blade of FIG. 1 also typically comprises a number of wiring termination blocks. The blocks facilitate the connection and distribution of current over a circuit passing through the coils of heat carrying material. Exemplary wiring termination blocks are shown in FIG. 4.

Figure 5:
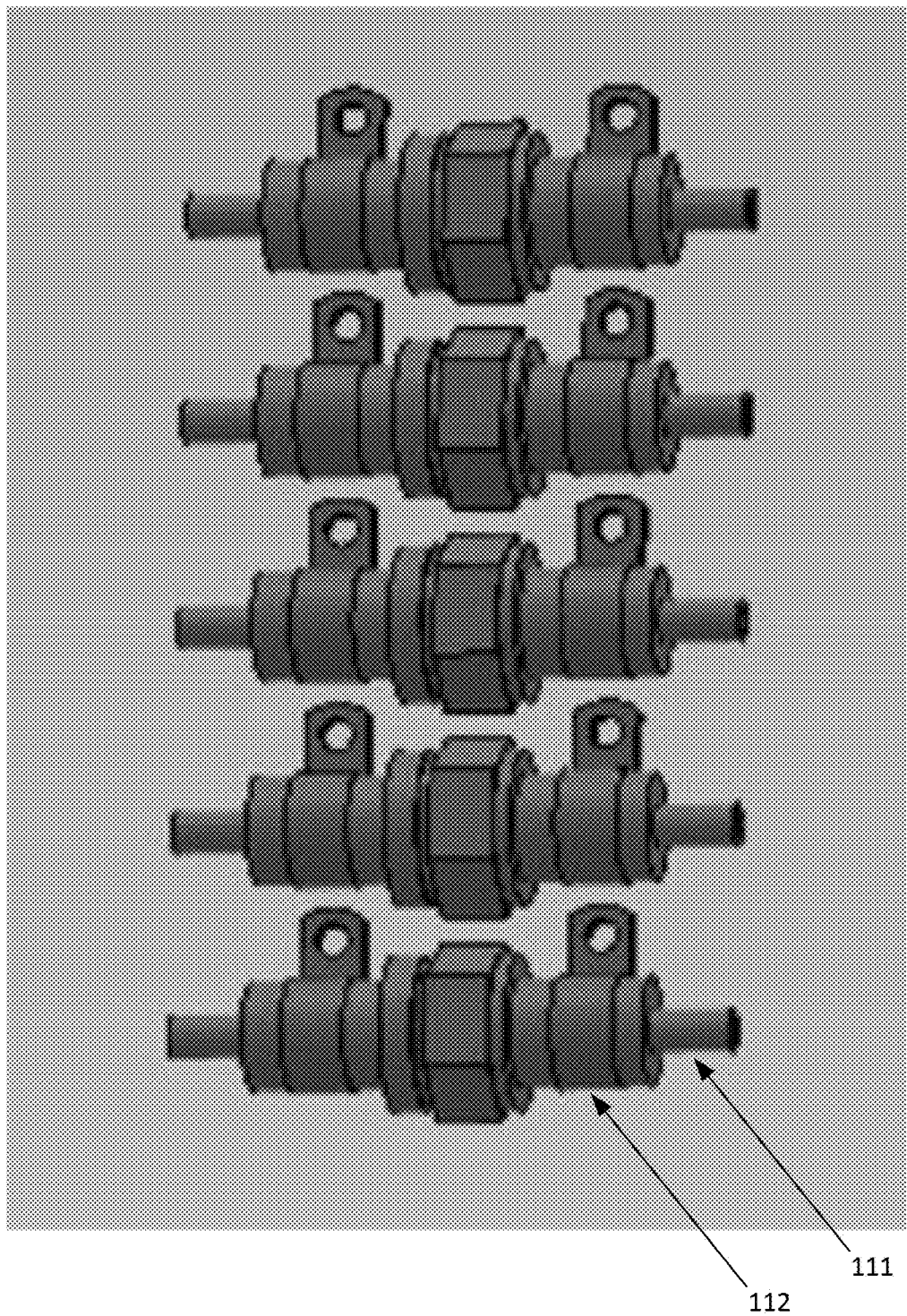
FIG. 5 shows a number of fuse holders and fuses for an exemplary heat blade.

The heat blade of FIG. 1 also typically comprises a number of fuse holders and fuses as shown in FIG. 5. These are typically placed in line within the wires between the wiring termination blocks and the coils of heat carrying materials.

Figure 6:
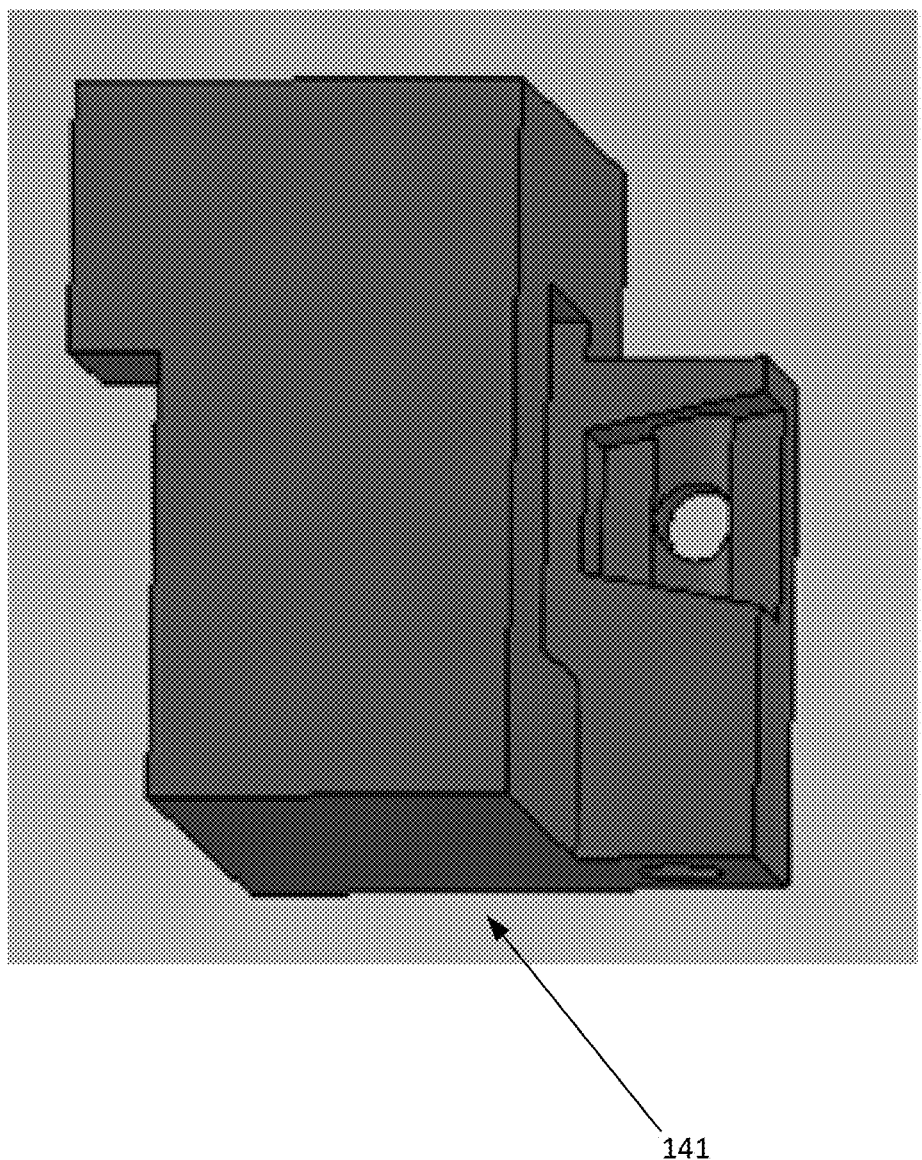
FIG. 6 shows an exemplary current transducer.

The heat blade of FIG. 1 also may comprises a current transducer through which one side of the current carrying circuit is run. This facilitates acquisition of data relating to the operating current of the device by a multi-unit testing management system. An exemplary current transducer is shown in FIG. 6.

The heat blade of FIG. 1 also may also comprise a solid state relay (not shown). The solid state relay may have one side of the relay wired to the testing apparatuses power input connection while the remainder of the circuit is wired to the output side within the testing apparatus. This facilitates control of the apparatus by the multi-unit testing management system.

Testing Methodology

The testing of a two phase liquid immersion cooling system may employ one or more tests to ensure the proper design, construction and operation of the unit.

Seal Testing

The general purpose of the seal testing process is to employ testing apparatuses to generate heat within a two phase liquid immersion cooling system and verify that the system is sealed appropriately. Typically, the unit is filled to its normal fluid level, populated with testing apparatuses, and made ready for standard operation. The testing apparatuses are energized, heat is created, and vapor is generated. The apparatuses continue to operate until the unit is at a full steady state condition and throughout the remainder of the testing process. A number of leak detection mechanisms, including, for example, integrated and handled halogen based refrigerant leak detectors are used to confirm that the seals are working properly.

Circulation and Filtering Testing

The general purpose of the circulation and filtering testing process is to ensure that the circulation and filtering systems within the two phase liquid immersion cooling system are working properly. The unit is filled to its normal fluid level, populated with testing apparatuses, and made ready for standard operation. The testing apparatuses are energized, heat is created, and vapor is generated. The apparatuses continue to operate until the unit is at a full steady state condition and throughout the remainder of the testing process. The circulation and filtering system is activated. The system is confirmed to be working properly through, for example, the visual verification of fluid being circulated throughout the two phase liquid immersion cooling system and by analyzing and verifying data generated by differential pressure sensors, if any, installed within the circulation system.

Vapor Management System Testing

The general purpose of the vapor management testing process is to ensure that the bellows and vapor recovery systems employed by the vapor management system are working properly. The unit is filled to its normal fluid level, populated with testing apparatuses, and made ready for standard operation. The testing apparatuses are energized, heat is created, and vapor is generated. The apparatuses continue to operate until the unit is at a full steady state condition and throughout the remainder of the testing process. The vapor management systems are activated. The bellows is confirmed to be operating properly by visually verifying that it inflates as expected. The vapor absorption process within the vapor management system is confirmed to be operating correctly by verifying that the bellows is deflated, and the vapor therein has been absorbed. The vapor desorption process within the vapor management system is confirmed to be operating correctly by verifying that the temperature within the vapor management unit is decreasing as the re-liquified vapor flows towards the bottom of the unit.

Specifications

The system specifications may vary depending upon the power employed, the materials, heat generation ranges, temperatures, and the like. Generally, the load within the test system should be similar electrically and/or similar thermally to what may be experienced in routine operation of the system at issue. Typically, the target temperature may be driven by the fluid in the system. Such temperatures vary but may be, for example, 50-60 C. Similarly, the target power densities of the blade may be tied to the power levels, e.g., 6000 watts, employed.

What is claimed is:

1. A heat blade assembly for testing two phase liquid immersion cooling components comprising: a chassis; a heat carrying material operably connected to the chassis; one or more wiring termination blocks configured to distribute electrical current through a circuit to the heat carrying material; one or more fuses between the wire termination blocks and heat carrying material; a current transducer configured to acquire data relating to the electrical current; and a solid state relay configured to allow control of the assembly by a multi-unit testing management system.

2. The heat blade assembly of claim 1, wherein the heat carrying material is a wire.

3. The heat blade assembly of claim 1, wherein the heat carrying material is a nickel chromium wire.

4. The heat blade assembly of claim 1, wherein the heat blade assembly further comprises coil winding substrates.

5. The heat blade assembly of claim 1, wherein the heat blade assembly further comprises coil winding substrates and wherein the heat carrying material is wound around the coil winding substrates.

6. The heat blade assembly of claim 1, wherein the heat blade assembly further comprises coil winding substrates and wherein the heat carrying material is wound around the coil winding substrates and wherein the heat carrying material is a nickel chromium wire.

7. The heat blade assembly of claim 1, wherein the heat blade assembly is configured to generate heat comparable to a blade server in the absence of a blade server.

8. A heat blade assembly for testing two phase liquid immersion cooling components comprising: a chassis; a heat carrying material operably connected to the chassis wherein the heat carrying material comprises nickel chromium wire; one or more wiring termination blocks configured to distribute electrical current through a circuit to the heat carrying material; one or more fuses between the wire termination blocks and heat carrying material; a current transducer configured to acquire data relating to the electrical current; a solid state relay configured to allow control of the assembly by a multi-unit testing management system; and coil winding substrates; wherein the nickel chromium wire heat is wound around the coil winding substrates.

9. The heat blade assembly of claim 8, wherein the heat blade assembly is configured to generate heat comparable to a blade server in the absence of a blade server.

10. The heat blade assembly of claim 8, wherein the heat blade assembly is configured to be heated to from about 50° C. to about 60° C.

11. A process for testing a two phase liquid immersion cooling tank for cooling server blades wherein the process comprises: replacing server blades with a heat blade assembly configured to generate heat comparable to server blades in the absence of server blades; filling the two phase liquid immersion cooling tank with dielectric fluid; operating the two phase liquid immersion cooling tank at a steady state condition; and detecting leaks with a detector external to the two phase liquid immersion cooling tank; and wherein the heat blade assembly configured to generate heat comparable to server blades in the absence of server blades comprises: a chassis; a heat carrying material operably connected to the chassis; one or more wiring termination blocks configured to distribute electrical current through a circuit to the heat carrying material; one or more fuses between the wire termination blocks and heat carrying material; a current transducer configured to acquire data relating to the electrical current; and a solid state relay configured to allow control of the assembly by a multi-unit testing management system.

12. The process of claim 11 which further comprises analyzing data from one or more differential pressure sensors located within the two phase liquid immersion cooling tank.

13. The process of claim 11 which further comprises analyzing data from one or more temperature sensors located within the two phase liquid immersion cooling tank.

14. The process of claim 11, wherein the heat blade assembly configured to generate heat comparable to server blades in the absence of server blades comprises: a chassis; a heat carrying material operably connected to the chassis wherein the heat carrying material comprises nickel chromium wire; one or more wiring termination blocks configured to distribute electrical current through a circuit to the heat carrying material; one or more fuses between the wire termination blocks and heat carrying material; a current transducer configured to acquire data relating to the electrical current; a solid state relay configured to allow control of the assembly by a multi-unit testing management system; and coil winding substrates; wherein the nickel chromium wire heat is wound around the coil winding substrates.

15. The process of claim 14 wherein the heat blade assembly is configured to be heated to from about 50° C. to about 60° C.

* * * * *